United States Patent
Nelson et al.

(10) Patent No.: US 12,127,384 B2
(45) Date of Patent: Oct. 22, 2024

(54) FILTER WITH COVER LAYER AND SHIELD LAYER

(71) Applicant: AVX Corporation, Fountain Inn, SC (US)

(72) Inventors: Cory Nelson, Murrells Inlet, SC (US); Gheorghe Korony, Myrtle Beach, SC (US)

(73) Assignee: KYOCERA AVX Components Corporation, Fountain Inn, SC (US)

( * ) Notice: Subject to any disclaimer, the term of this patent is extended or adjusted under 35 U.S.C. 154(b) by 763 days.

(21) Appl. No.: 17/307,015

(22) Filed: May 4, 2021

(65) Prior Publication Data

US 2021/0360837 A1 Nov. 18, 2021

Related U.S. Application Data

(60) Provisional application No. 63/024,017, filed on May 13, 2020.

(51) Int. Cl.
*H05K 9/00* (2006.01)
*H03H 9/56* (2006.01)

(52) U.S. Cl.
CPC ............. *H05K 9/0081* (2013.01); *H03H 9/56* (2013.01); *H03H 9/562* (2013.01)

(58) Field of Classification Search
CPC ...... H05K 9/0081; H05K 9/0066; H03H 9/56; H03H 9/562
See application file for complete search history.

(56) References Cited

U.S. PATENT DOCUMENTS

| | | | |
|---|---|---|---|
| 3,727,154 A * | 4/1973 | Dailing | H03H 9/545 333/191 |
| 6,369,489 B1 * | 4/2002 | Sawai | H03H 9/1014 310/326 |
| 6,663,943 B2 | 12/2003 | Kadota | |
| 7,215,223 B2 | 5/2007 | Hattanda et al. | |
| 9,252,733 B2 | 2/2016 | Adkisson et al. | |
| 9,654,084 B2 | 5/2017 | You | |
| 10,340,882 B2 | 7/2019 | Yi | |

OTHER PUBLICATIONS

International Search Report and Written Opinion for PCT/US2021/030620 dated Aug. 20, 2021, 11 pages.

* cited by examiner

*Primary Examiner* — Emily P Pham
(74) *Attorney, Agent, or Firm* — Dority & Manning, P.A.

(57) ABSTRACT

A filter can include a monolithic substrate and at least one conductive layer formed over a top surface of the monolithic substrate and along at least a portion of one or more of a first top edge of the monolithic substrate or a second top edge of the monolithic substrate. A cover layer can be arranged over the top surface of the monolithic substrate. A shield layer can connect with one or more of the conductive layer(s) at the first top edge or the second top edge of the monolithic substrate. The shield layer can include a first portion formed over the first side surface of the cover layer, a second portion formed over the top surface of the cover layer, and a third portion formed over the second side surface of the cover layer.

17 Claims, 10 Drawing Sheets

FILTER WITH COVER LAYER AND SHIELD LAYER

CROSS REFERENCE TO RELATED APPLICATION

The present application claims filing benefit of U.S. Provisional Patent Application Ser. No. 63/024,017 having a filing date of May 13, 2020, which is incorporated herein by reference in its entirety.

BACKGROUND OF THE INVENTION

Passive filter devices can filter select frequency ranges from an electric signal. Electromagnetic radiation, however, can adversely affect performance of such passive filter devices. Accordingly, a filter having improved shielding would be welcomed in the art.

SUMMARY OF THE INVENTION

In accordance with one embodiment of the present invention, a filter can include a monolithic substrate having a top surface, a first side surface perpendicular to the top surface, a second side surface perpendicular to the top surface, a first top edge along an intersection between the top surface and the first side surface, and a second top edge opposite the first top edge and along an intersection between the top surface and the second side surface. The filter can include at least one conductive layer formed over the top surface of the monolithic substrate and along at least a portion of one or more of the first top edge of the monolithic substrate or the second top edge of the monolithic substrate. The filter can include a cover layer arranged over the top surface of the monolithic substrate. The cover layer can have a top surface parallel with the top surface of the monolithic substrate. The cover layer can have a first side surface and a second side surface opposite the first side surface. The first side surface of the cover layer can be parallel with the first side surface of the monolithic substrate, and the second side surface of the cover layer can be parallel with the second side surface of the monolithic substrate. The filter can include a shield layer that connects with one or more of the at least one conductive layer at one or more of the first top edge or the second top edge of the monolithic substrate. The shield layer can include a first portion formed over the first side surface of the cover layer, a second portion formed over the top surface of the cover layer, and a third portion formed over the second side surface of the cover layer.

In accordance with another embodiment of the present invention, a method of forming a filter can include providing a monolithic substrate having a top surface, a first side surface perpendicular to the top surface, a second side surface perpendicular to the top surface, a first top edge along an intersection between the top surface and the first side surface, and a second top edge opposite the first top edge and along an intersection between the top surface and the second side surface. The method can include forming at least one conductive layer over the top surface of the monolithic substrate and along at least a portion of one or more of the first top edge of the monolithic substrate or the second top edge of the monolithic substrate. The method can include arranging a cover layer over the top surface of the monolithic substrate. The cover layer can have a top surface parallel with the top surface of the monolithic substrate. The cover layer can have a first side surface and a second side surface opposite the first side surface. The first side surface of the cover layer can be parallel with the first side surface of the monolithic substrate, and the second side surface of the cover layer can be parallel with the second side surface of the monolithic substrate. The method can include forming a shield layer that connects with one or more of the at least one conductive layer at one or more of the first top edge or the second top edge of the monolithic substrate. The shield layer can include a first portion formed over the first side surface of the cover layer, a second portion formed over the top surface of the cover layer, and a third portion formed over the second side surface of the cover layer.

In accordance with another embodiment of the present invention, A filter can include a monolithic substrate having a top surface and a first conductive layer formed over the top surface of the monolithic substrate. The first conductive layer can include a first plurality of resonator arms. A second conductive layer can be formed over the top surface of the monolithic substrate. The second conductive layer can include a second plurality of resonator arms interdigitated with the first plurality of resonator arms of the first conductive layer. The filter can exhibit an insertion loss response having a band pass frequency range that has a lower bound that is greater than 10 GHz and an upper bound that is greater than the lower limit by less than about 10 GHz.

In accordance with another embodiment of the present invention, A filter can include a monolithic substrate having a top surface and a first conductive layer formed over the top surface of the monolithic substrate. The first conductive layer can include a first plurality of resonator arms. A second conductive layer can be formed over the top surface of the monolithic substrate. The second conductive layer can include a second plurality of resonator arms interdigitated with the first plurality of resonator arms of the first conductive layer. The filter can exhibit an insertion loss response having a band pass frequency range that that has a lower bound, an upper bound, and a rate of decrease from at least one of the lower bound or the upper that is greater than about 10 dB per GHz.

BRIEF DESCRIPTION OF THE DRAWINGS

A full and enabling disclosure of the present invention, including the best mode thereof, directed to one of ordinary skill in the art, is set forth more particularly in the remainder of the specification, which makes reference to the appended figure in which.

Figure 1A:
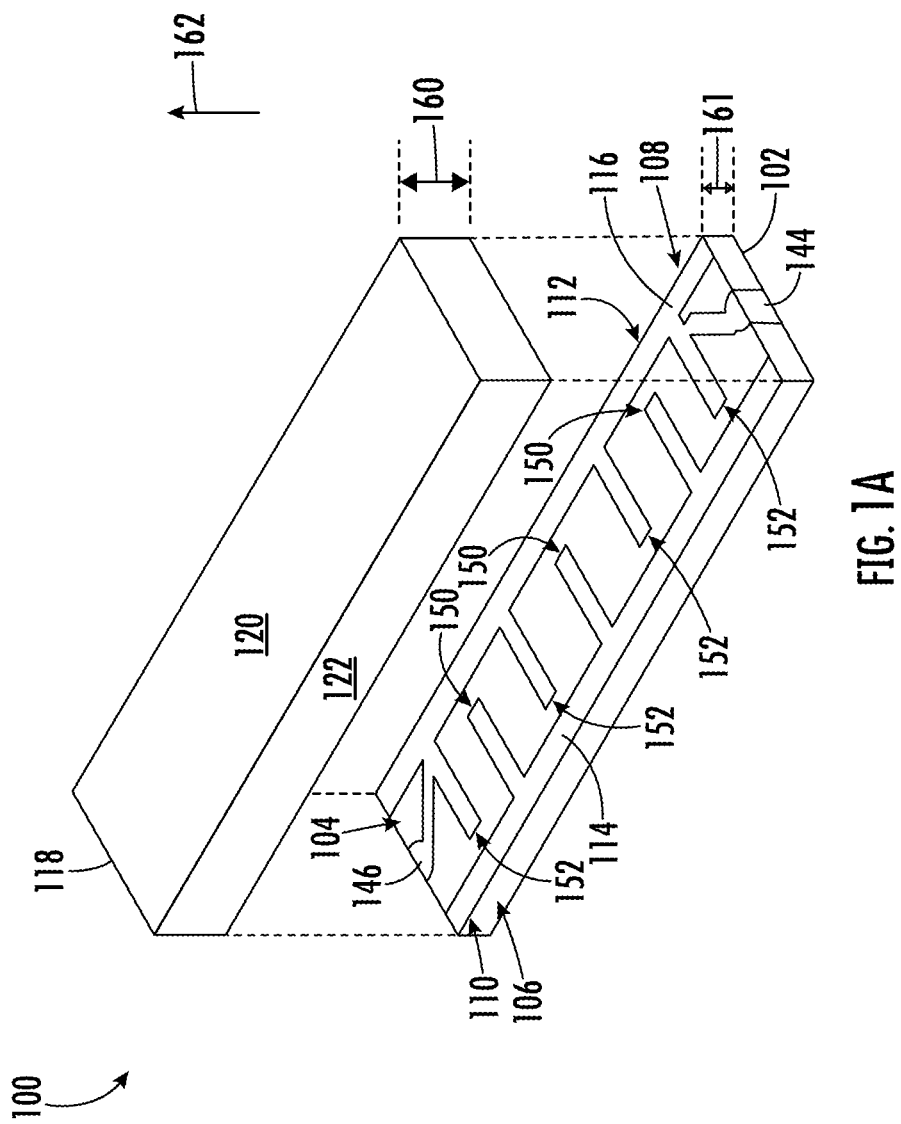
FIG. 1A illustrates an exploded, perspective view of an example embodiment of a filter without a shield layer.

Repeat use of reference characters in the present specification and drawing is intended to represent same or analogous features or elements of the invention.

DETAILED DESCRIPTION OF REPRESENTATIVE EMBODIMENTS

It is to be understood by one of ordinary skill in the art that the present discussion is a description of exemplary embodiments only, and is not intended as limiting the broader aspects of the present invention, which broader aspects are embodied in the exemplary construction.

Generally speaking, the present invention is directed to a filter having a configuration that provides improved performance characteristics. The filter can include a shield layer and a cover layer that can providing excellent electromagnetic shielding for one or more conductive layers. Further, dimensions of the cover layer and shield layer can be selected to fine tune performance characteristics of the filter. The performance characteristics can include one or more aspects of a band pass frequency range of the filter. For example, the filter can exhibit a narrow band pass frequency range and/or excellent out-of-band rejection.

The filter can exhibit excellent performance characteristics. The filter can exhibit an insertion loss response having a narrow band pass frequency range. For example, the band pass frequency range can have a lower bound that is greater than 10 GHz and an upper bound that is greater than the lower limit by less than about 10 GHz, in some embodiments less than about 8 GHz, in some embodiments less than about 6 GHz, and in some embodiments less than about 5 GHz. Additionally, it should be understood that the filter can have a variety of configurations. For example, the filter can be configured as a bandpass filter, a high pass filter, or a low pass filter.

The filter can exhibit an insertion loss response having a band pass frequency range that that has a lower bound, an upper bound, and a rate of decrease from at least one of the lower bound or the upper that is greater than about 10 dB per GHz, in some embodiments greater than about 15 dB per GHz, in some embodiments greater than about 20 dB per GHz, in some embodiments greater than about 22 dB per GHz, in some embodiments greater than about 24 dB per GHz, in some embodiments greater than about 26 dB per GHz, in some embodiments greater than about 28 dB per GHz.

The filer can include a monolithic substrate having a top surface, a first side surface perpendicular to the top surface, a second side surface perpendicular to the top surface, a first top edge along an intersection between the top surface and the first side surface, and a second top edge opposite the first top edge and along an intersection between the top surface and the second side surface.

The filter can include at least one conductive layer formed over the top surface of the monolithic substrate and along at least a portion of one or more of the first top edge of the monolithic substrate or the second top edge of the monolithic substrate.

The filter can include a cover layer arranged over the top surface of the monolithic substrate. The cover layer can have a top surface parallel with the top surface of the monolithic substrate. The cover layer can have a first side surface and a second side surface opposite the first side surface. The first side surface of the cover layer can be parallel with the first side surface of the monolithic substrate, and the second side surface of the cover layer can be parallel with the second side surface of the monolithic substrate.

The filter can include a shield layer that connects with one or more of the conductive layer(s) at one or more of the first top edge or the second top edge of the monolithic substrate. The shield layer can include a first portion formed over the first side surface of the cover layer, a second portion formed over the top surface of the cover layer, and a third portion formed over the second side surface of the cover layer.

In some embodiments, the first side surface of the cover layer can be parallel with the first side surface of the monolithic substrate. The second side surface of the cover layer can be coplanar with the second side surface of the monolithic substrate.

In some embodiments, the first portion of the shield layer can be formed over the first side surface of the monolithic substrate, and the second portion of the shield layer can also be formed over the second side surface of the monolithic substrate.

In some embodiments, the shield layer can be exposed along a bottom of the filter, for example, for connecting with a ground terminal on a substrate. More specifically, the monolithic substrate can have a bottom surface that is opposite the top surface of the monolithic substrate. The shield layer can include a fourth portion formed over the bottom surface of the monolithic substrate.

In some embodiments, the shield layer can extend to bottom edges of the monolithic substrate. More specifically, the monolithic substrate can have a bottom surface that is opposite the top surface of the monolithic substrate, a first bottom edge between the bottom surface of the monolithic substrate and the first side surface of the monolithic substrate, and a second bottom edge between the bottom surface of the monolithic substrate and the second side surface of the monolithic substrate. The shield layer can include a fourth portion formed over the bottom surface of the monolithic substrate and along at least a portion of the first bottom edge of the monolithic substrate. The shield layer can include a fifth portion formed over the bottom surface of the monolithic substrate and along at least a portion of the second bottom edge of the monolithic substrate.

In some embodiments, a first conductive layer and a second conductive layer can be formed over the top surface of the substrate. The shield layer can connect with the first conductive layer at the first top edge of the monolithic substrate. The shield layer can connect with the second conductive layer at the second top edge of the monolithic substrate.

In some embodiments, the shield layer can include a first portion formed over the first side surface of the cover layer, a second portion formed over the top surface of the cover layer, and a third portion formed over the second side surface of the cover layer.

In some embodiments, a first conductive layer and second conductive layer can be formed over the top surface of the substrate. The first conductive layer can include a first plurality of resonator arms, and the second conductive layer can include a second plurality of resonator arms interdigitated with the first plurality of resonator arms of the first conductive layer. Thus, the conductive layers can have a configuration including interdigitated arms.

The conductive layers can be dimensioned to provide the desired characteristics for the filter. For example, the first plurality of resonator arms can have first widths in a first direction. The second plurality of resonator arms can have second widths in the first direction. The first widths and/or second widths can range from about 0.03 mm to about 1 mm, in some embodiments from about 0.05 mm to about 0.8 mm, in some embodiments from about 0.08 mm to about 0.4 mm, in some embodiments from about 0.1 mm to about 0.2 mm.

In some embodiments, different arms of the first plurality of resonator arms can have different first widths. For example, outermost arms of the first plurality of arms can have respective widths that can be greater than or less than a width of one or more inner arms of the first plurality of arms. For example, a ratio of the outermost arms to the inner arms can range from about 0.8 to about 1.2, in some embodiments from about 0.9 to about 1, in some embodiments from about 1 to about 1.2, add in some embodiments from about 1 to about 1.1.

Similarly, different arms of the second plurality of resonator arms can have different second widths. For example, outer arms of the second plurality of arms can have respective widths that can be greater than or less than respective widths of one or more inner arms of the first plurality of arms. For example, a ratio of the outermost arms to the inner arms can range from about 0.8 to about 1.2, in some embodiments from about 0.9 to about 1, in some embodiments from about 1 to about 1.2, add in some embodiments from about 1 to about 1.1.

The first conductive layer can have a first edge aligned with the first direction and aligned with an edge of the monolithic substrate in a second direction that is perpendicular with the first direction. The second conductive layer can have a second edge aligned with the first direction and aligned with a first edge of the monolithic substrate in the second direction. The first conductive layer can have a base portion having a base width in the second direction. The second conductive layer can have a base portion having a base width in the second direction. The base widths of the first conductive layers and/or the base widths of the second conductive layers can range from about 0.03 mm to about 1 mm, in some embodiments from about 0.05 mm to about 0.8 mm, in some embodiments from about 0.08 mm to about 0.4 mm, in some embodiments from about 0.1 mm to about 0.3 mm.

The first plurality of resonator arms can have respective lengths in the second direction, and the second plurality of arms can have respective lengths in the second direction. The lengths of first plurality of resonator arms and/or lengths of the second plurality of arms can range from about 0.02 mm to about 2 mm, in some embodiments from about 0.05 mm to about 1.5 mm, in some embodiments from about 0.1 mm to about 1.2 mm, and in some embodiments from about 0.5 mm to about 1 mm.

The second conductive layer can include one or more feed lines respectively connected with vias. The vias can have respective widths in the second direction. The widths of the vias can range from about 0.05 mm to about 0.5 mm, in some embodiments from about 0.7 mm to about 0.4 mm, and in some embodiments from about 0.1 mm to about 2 mm.

The conductive layers can have a length in the first direction and a width in the second direction. The length of the conductive layers can range from about 1 mm to about 15 mm, in some embodiments from about 2 mm to about 10 mm, and in some embodiments from about 3 mm to about 7 mm. The width of the conductive layers can range from about 0.3 mm to about 4 mm, in some embodiments from about 0.4 mm to about 3 mm, in some embodiments from about 0.5 mm to about 2 mm, and in some embodiments from about 0.8 mm to about 1.5 mm. A ratio of the length to the width of the conductive layers can range from about 2 to about 8, and in some embodiments from about 3 to about 6.

Aspects of the present disclosure are directed to a method of forming a filter. The method can include providing a monolithic substrate having a top surface, a first side surface perpendicular to the top surface, a second side surface perpendicular to the top surface, a first top edge along an intersection between the top surface and the first side surface, and a second top edge opposite the first top edge and along an intersection between the top surface and the second side surface. The method can include forming at least one conductive layer over the top surface of the monolithic substrate and along at least a portion of one or more of the first top edge of the monolithic substrate or the second top edge of the monolithic substrate. The method can include arranging a cover layer over the top surface of the monolithic substrate, the cover layer having a top surface parallel with the top surface of the monolithic substrate, the cover layer having a first side surface and a second side surface opposite the first side surface, and wherein the first side surface of the cover layer is coplanar with the first side surface of the monolithic substrate, and the second side surface of the cover layer is coplanar with the second side surface of the monolithic substrate. The method can include forming a shield layer that connects with one or more of the at least one conductive layer at one or more of the first top edge or the second top edge of the monolithic substrate. The shield layer can include a first portion formed over the first side surface of the cover layer, a second portion formed over the top surface of the cover layer, and a third portion formed over the second side surface of the cover layer.

The substrate can have a range of thicknesses. For example, in some embodiments, the thickness of the substrate can range from about 50 μm to about 2,000 μm, in some embodiments from about 75 μm to about 1,000 μm, in some embodiments from about 100 μm to about 500 μm, in some embodiments from about 150 μm to about 500 μm, and in some embodiments from about 200 μm to about 300 μm.

The substrate can be formed from a variety of suitable materials. For example, the substrate can include alumina, barium titanate, calcium titanate, zinc oxide, or other suitable ceramic or glass-bonded materials.

The cover layer can have a range of thicknesses. For example, in some embodiments, the thickness of the cover layer can range from about 250 μm to about 3,000 μm, in some embodiments from about 500 μm to about 2,500 μm, in some embodiments from about 750 μm to about 2,000 μm, and in some embodiments from about 1,000 μm to about 1,500 μm.

The cover layer can be formed from a variety of suitable materials. For example, the cover layer can include glass, ceramic, a glass-ceramic mixture, and/or a glass-bonded material.

The conductive layers can include a variety of conductive materials and can be formed using a variety of suitable techniques. For example, the conductive layers can include gold, copper, tin, and/or any other suitable conductive material. The conductive layers can be formed over the substrate by sputtering, plating, printing, and/or any other suitable deposition techniques. For example, in some embodiments, a lower layer of the respective conductive layers can first be formed with sputtering, and an upper layer of the conductive layers can be formed on the lower layer using a suitable plating technique (e.g., electrolytic plating, electroless plating, etc.).

The shield layer can include gold, copper, tin, and/or any other suitable conductive material. The conductive layers can be formed on the cover layer and/or substrate using a variety of suitable techniques, such as plating, sputtering, printing, dipping (e.g., thick film and/or thin film) and/or any other suitable deposition techniques.

I. Example Embodiments

Figure 1B:
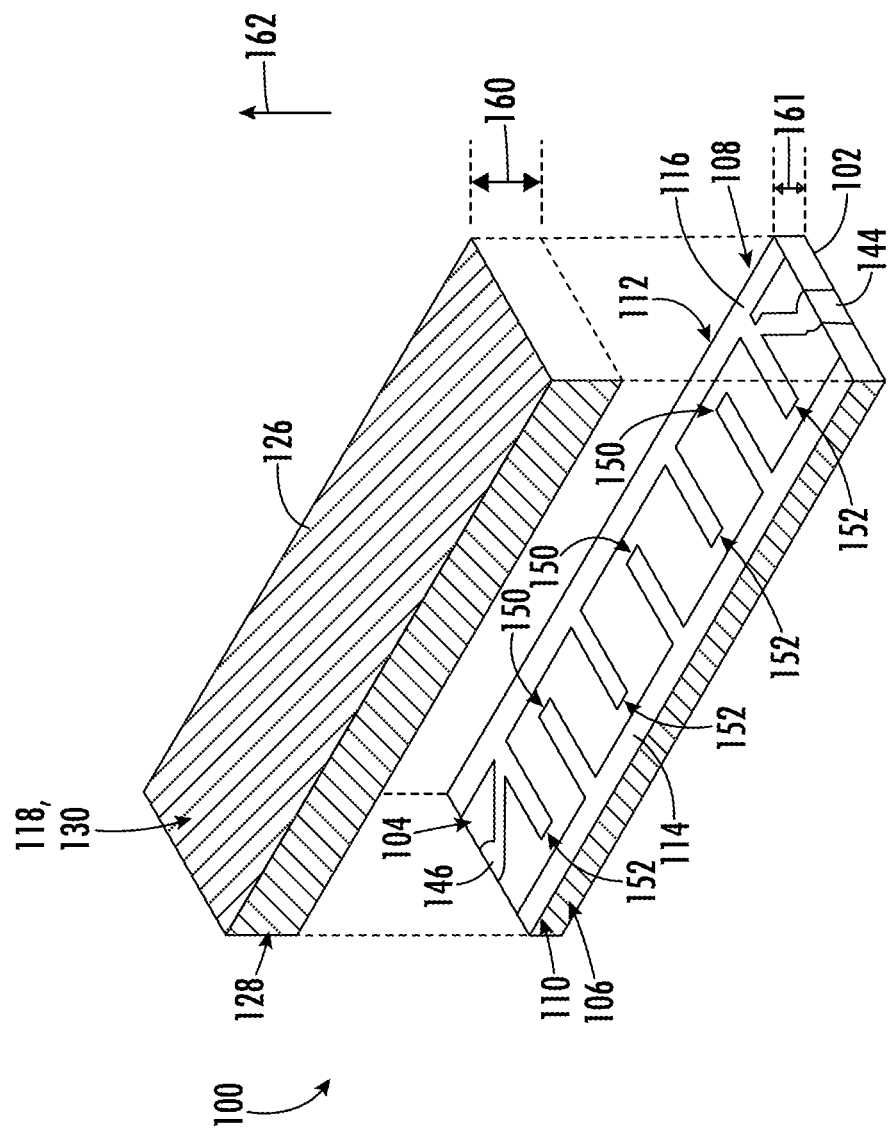
FIG. 1B illustrates an exploded, perspective view of the filter of FIG. 1A including a shield layer.
Figure 2A:
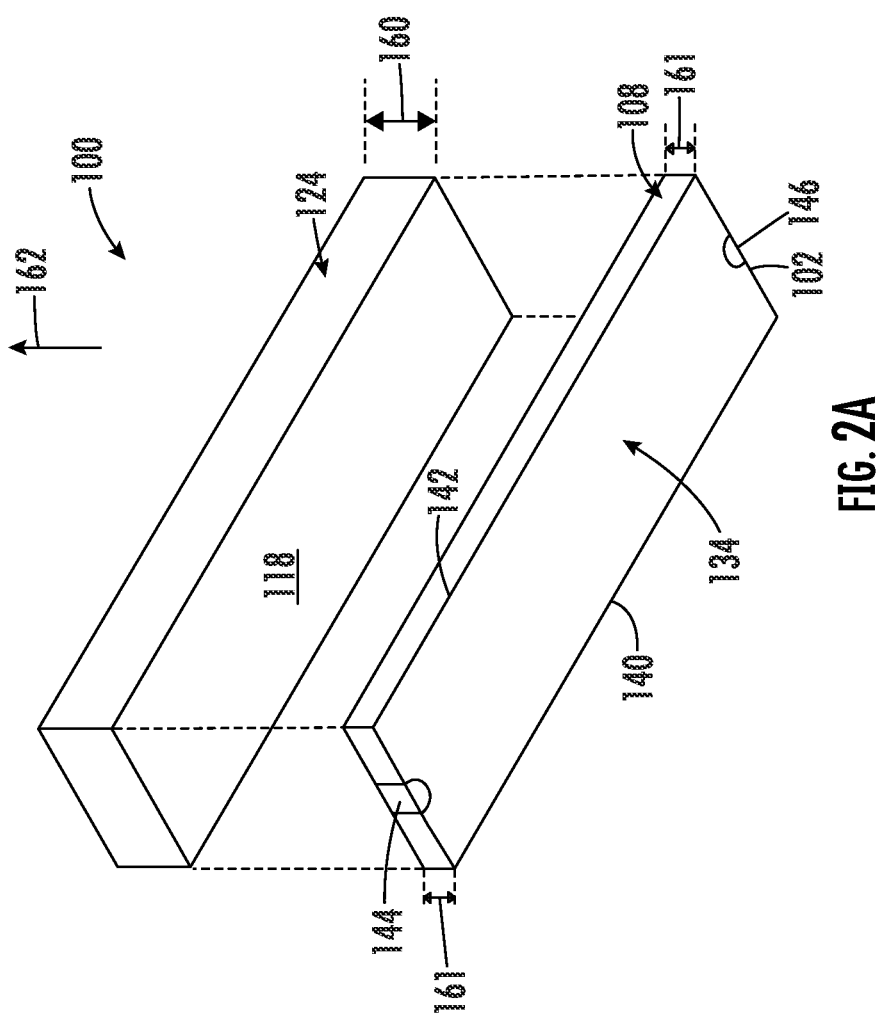
FIG. 2A illustrates another exploded, perspective view of the filter of FIG. 1A without the shield layer.
Figure 2B:
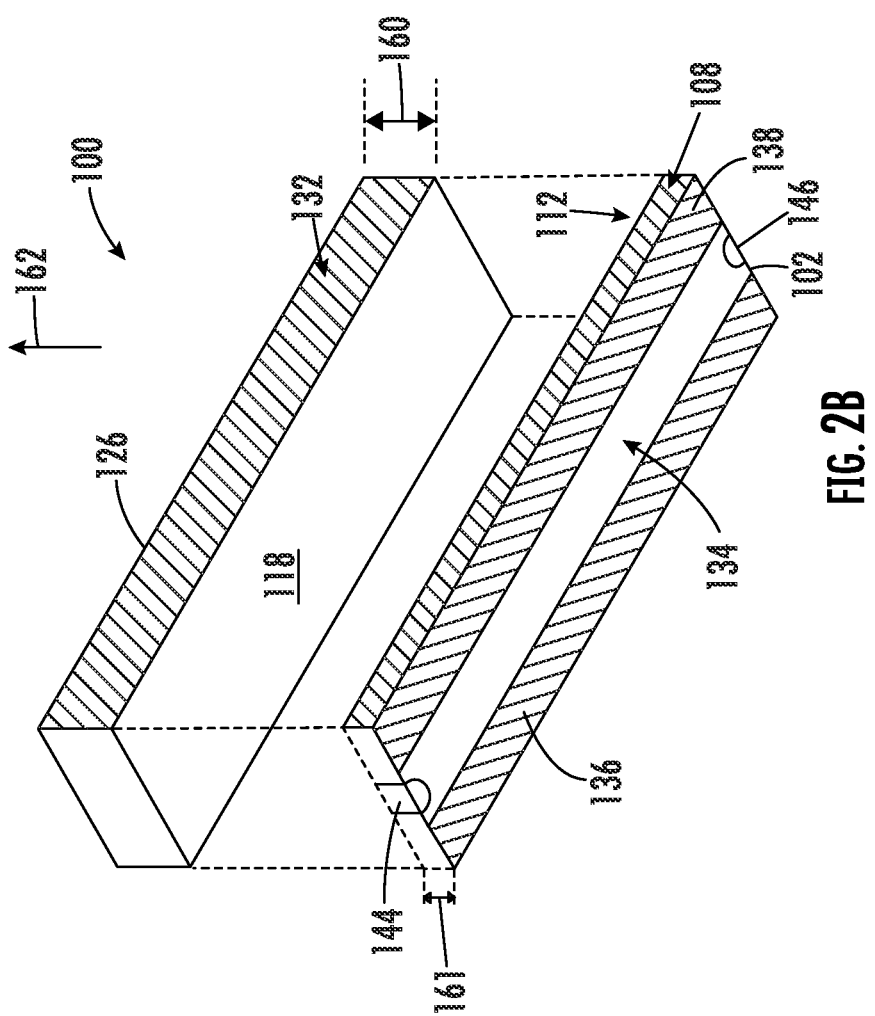
FIG. 2B illustrates another exploded, perspective view of the filter of FIG. 1 including the shield layer.
Figure 3:
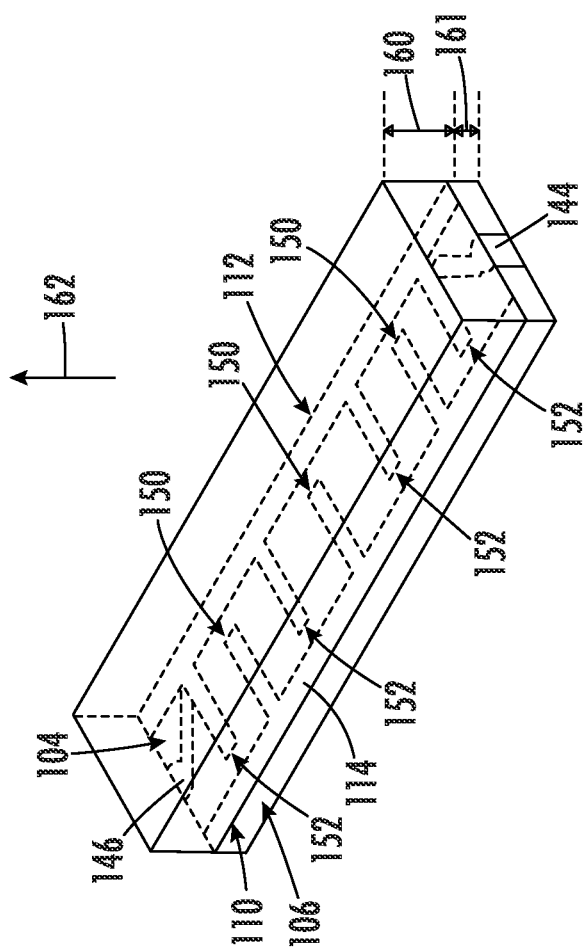
FIG. 3 illustrates an assembled perspective view of the filter of FIG. 1A.
Figure 4:
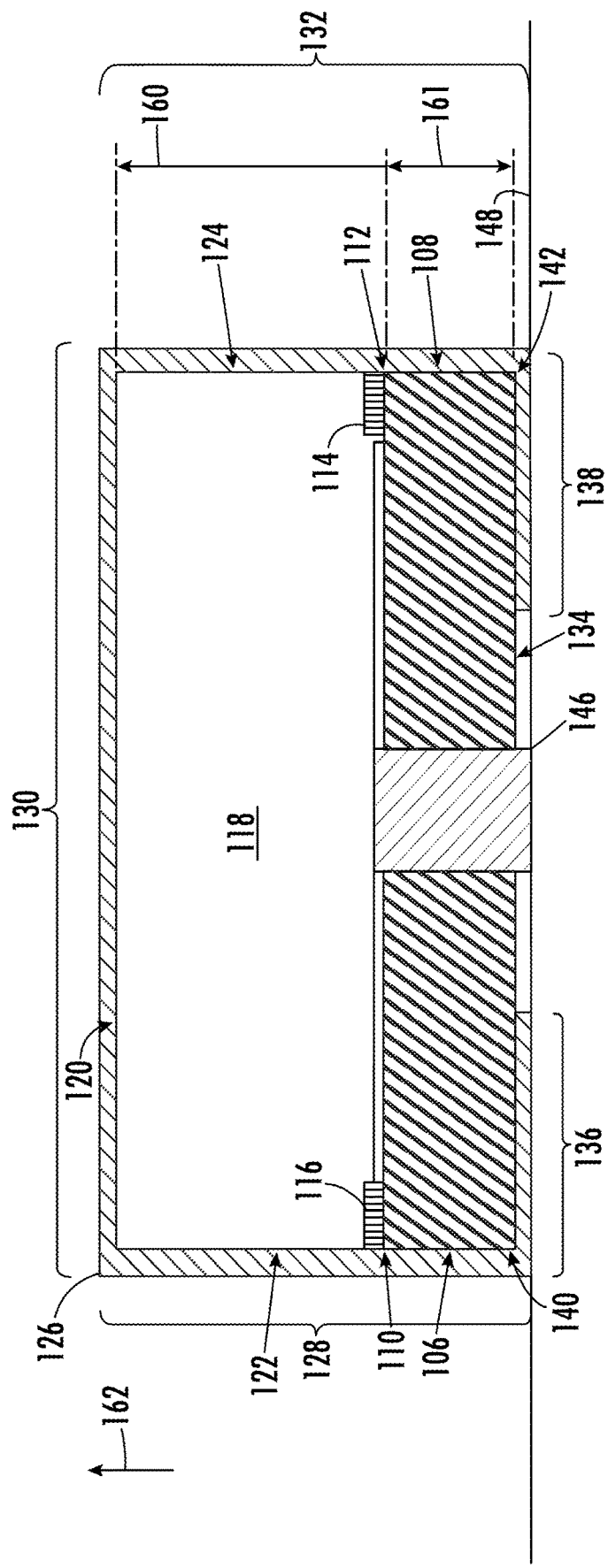
FIG. 4 illustrates a cross-sectional side elevation of the filter of FIG. 1A.

FIG. 1A illustrates an exploded, perspective view of an example embodiment of a filter 100 without a shield layer. FIG. 1B illustrates an exploded, perspective view of the filter 100 of FIG. 1A including the shield layer. FIG. 2A illustrates another exploded, perspective view of the filter 100 of FIG. 1A without the shield layer. FIG. 2B illustrates another exploded, perspective view of the filter 100 of FIG. 1 including the shield layer. FIG. 3 illustrates an assembled perspective view of the filter 100 of FIG. 1A. FIG. 4 illustrates a cross-sectional side elevation of the filter 100 of FIG. 1A.

The filter 100 can include a monolithic substrate 102 having a top surface 104, a first side surface 106 perpendicular to the top surface 104, a second side surface 108 perpendicular to the top surface 104. The monolithic substrate 102 can have a first top edge 110 along an intersection between the top surface 104 and the first side surface 106, and a second top edge 112 opposite the first top edge 110 and along an intersection between the top surface 104 and the second side surface 108 (FIG. 2A).

The filter 100 can include a first conductive trace 114 formed over the top surface 104 of the monolithic substrate 102 and along at least a portion of the first top edge 110 of the monolithic substrate 102. The filter 100 can include a second conductive trace 116 formed over the top surface 104 of the monolithic substrate 102 and along at least a portion of the second top edge 112 of the monolithic substrate 102.

The filter 100 can include a cover layer 118 arranged over the top surface 104 of the monolithic substrate 102. The cover layer 118 can have a top surface 120 parallel with the top surface 104 of the monolithic substrate 102. The cover layer 118 can have a first side surface 122 and a second side surface 124 (FIG. 2A) opposite the first side surface 122.

The first side surface 122 of the cover layer 118 can be coplanar and/or parallel with the first side surface 106 of the monolithic substrate 102. The second side surface 124 of the cover layer 118 can be coplanar and/or parallel with the second side surface 108 of the monolithic substrate 102.

FIG. 1B illustrates an exploded, perspective view of the filter 100 of FIG. 1A additionally showing a shield layer 126. The shield layer 126 can connect with the first conductive layer 114 at the first top edge 110 of the monolithic substrate 102. The shield layer 126 can connect with the second conductive layer 116 at the second top edge 112 of the monolithic substrate 102. The shield layer 126 can include a first portion 128 (FIG. 1B) formed over the first side surface 122 (FIG. 1A) of the cover layer 118. The shield layer 126 can include a second portion 130 (FIG. 1B) formed over the top surface 120 of the cover layer 118. The shield layer 126 and a third portion 132 (FIG. 2B) formed over the second side surface 124 (FIG. 2A) of the cover layer 118. Thus, the shield layer 126 can act as an electromagnetic shield for the conductive layers 114, 116.

In some embodiments, the shield layer 126 can extend along one or more of the side surfaces 106, 108 of the monolithic substrate 102 and/or can wrap around to a bottom of the filter 100. For example, the shield layer 126 can connect to a ground or act as a ground along the bottom of the filter 100. For example, referring to FIGS. 2A and 2B, the monolithic substrate 102 can have a bottom surface 134 that is opposite the top surface 104 of the monolithic substrate 102. Referring to FIG. 2B, the shield layer 126 can include a fourth portion 136 and/or a fifth portion 138 formed over the bottom surface 134 of the monolithic substrate 102. For example, a first bottom edge 140 can be formed at an intersection of the bottom surface 134 of the monolithic substrate 102 and the first side surface 106 (FIG. 1A) of the monolithic substrate 102. A second bottom edge 142 can be formed at an intersection of the bottom surface 134 of the monolithic substrate 102 and the second side surface 108 (FIG. 2A) of the monolithic substrate 102. The fourth portion 136 of the shield layer 126 can be formed over the bottom surface 134 of the monolithic substrate 102 and along at least a portion of the first bottom edge 140 of the monolithic substrate 102. The fifth portion 138 of the monolithic substrate 102 can be formed over the bottom surface 134 of the monolithic substrate 102 and along at least a portion of the second bottom edge 142 of the monolithic substrate 102. The fourth portion 126 and/or fifth portion 138 of the shield layer 126 can electrically connect with a ground connection, for example, of a mounting surface 148 (FIG. 4), such as a printed circuit board.

In some embodiments, the filter 100 can include one or more vias 144, 146 electrically connected with one or more of the conductive traces 114, 116. The vias 144, 146 can extend to and/be exposed along the bottom surface 134 of the monolithic substrate 102. The vias 144, 146 can facilitate electrical connection with the conductive traces 114, 116 with the mounting surface 148 (FIG. 4), such as a printed circuit board. For example, an input via 144 can be electrically connected with the first conductive trace 144 and can act as input to the filter 100. An output via 146 can be electrically connected with second conductive trace 146 and act as an output for the filter 100.

The conductive traces 114, 116 can have a variety of arrangements configured to provide filtering between an input (e.g., via 144) and an output (e.g., via 146). One example configuration is illustrated in FIGS. 1 through 3. The conductive traces 114, 116 can include interdigitated resonator arms. For example, the first conductive trace 114 can include a first plurality of resonator arms 150. The second conductive trace 116 can include a second plurality of resonator arms 152. The first plurality of resonator arms 150 can be interdigitated with the second plurality of resonator arms 152.

The cover layer 118 can have a thickness 160 in a Z-direction 162 that is perpendicular to the top surface 104 of the monolithic substrate 102. The thickness 160 of the cover layer 118 can be selected to achieve the desired response characteristics of the filter 100, for example as described below with reference to FIG. 7.

The substrate 102 can have a thickness 161 in the Z-direction 162. For example, the thickness 161 of the substrate 102 can range from about 50 μm to about 2,000 μm.

Figure 5:
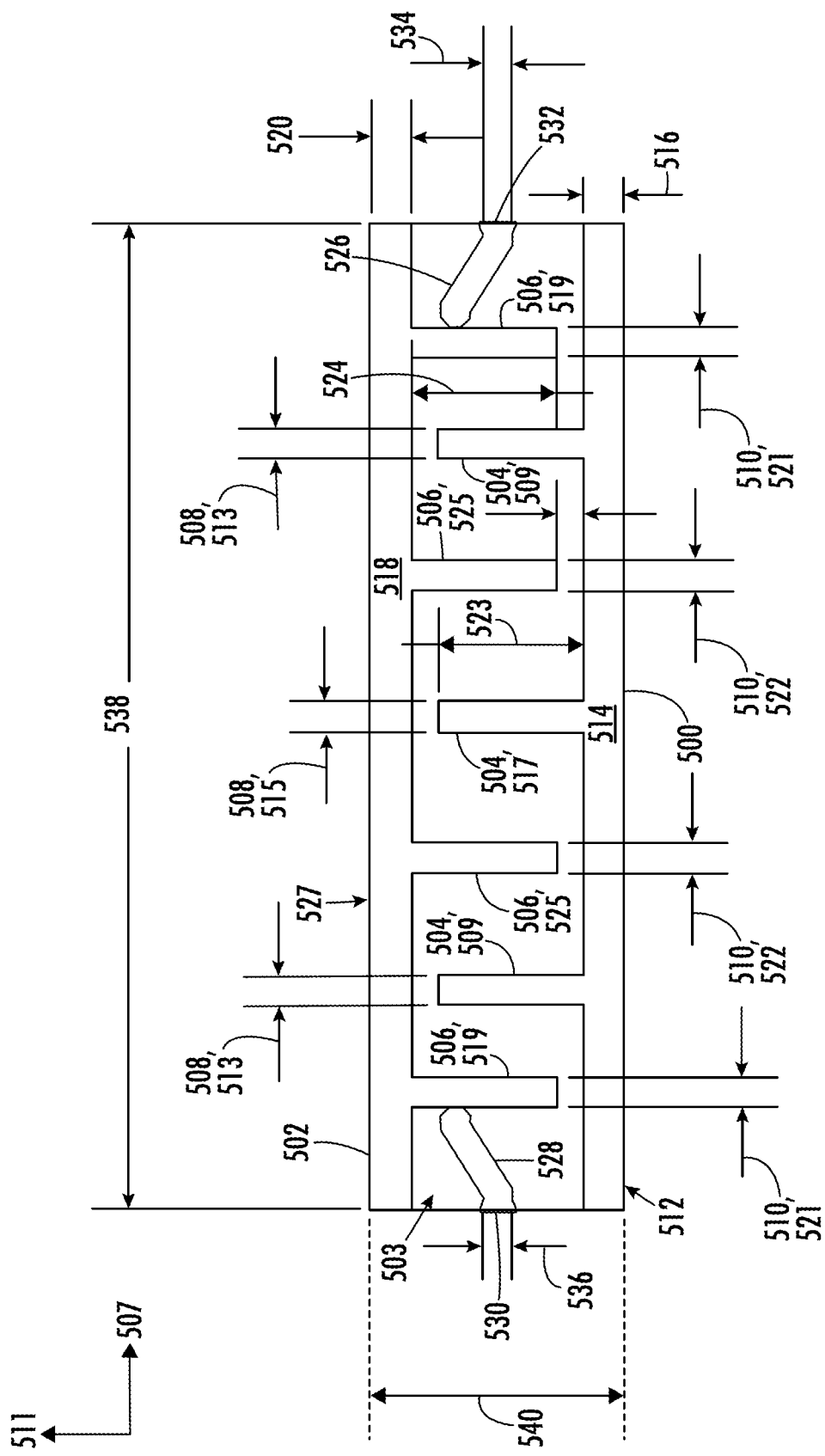
FIG. 5 illustrates a top-down schematic of conductive traces of a filter according to aspects of the present disclosure.

FIG. 5 illustrates a top-down schematic of a first conductive layer 500 and second conductive layer 502 formed on a top surface 503 of a monolithic substrate of a filter (e.g., corresponding with the filter 100 of FIG. 1). More specifically, the first conductive layer 500 (e.g., corresponding with the first conductive layer 114 of FIGS. 1-4) can include a first plurality of resonator arms 504. The second conductive layer 502 (e.g., corresponding with the second conductive layer 116 of FIGS. 1-4) can include a second plurality of resonator arms 506. The first plurality of resonator arms 504 can have first widths 508 in a first direction 507. The second plurality of resonator arms 506 can have second widths 510 in the first direction 507.

In some embodiments, different arms 504 of the first plurality of resonator arms 504 can have different first widths 508. For example, outermost arms 509 of the first plurality of arms 504 can have respective widths 513 that can be greater than or less than a width 515 of one or more inner arms 517 of the first plurality of arms 504. For example, a ratio of the outermost arms 509 to the inner arms 517 can range from about 0.9 to about 1.1.

Similarly, different arms 506 of the second plurality of resonator arms 506 can have different second widths 510. For example, outer arms 519 of the second plurality of arms 506 can have respective widths 521 that can be greater than or less than respective widths 522 of one or more inner arms 525 of the first plurality of arms 506. For example, a ratio of the outermost arms 519 to the inner arms 525 can range from about 0.9 to about 1.1.

The first conductive layer 500 can have a first edge 512 aligned with the first direction 507. The first edge 512 can be aligned with an edge of the monolithic substrate 503 in a second direction 511 that is perpendicular with the first direction 507. The second conductive layer 502 can have a second edge 514 aligned with the first direction 507 and aligned with a first edge of the monolithic substrate 503 in the second direction 511. The first conductive layer 500 can have a base portion 514 having a base width 516 in the second direction 511. The second conductive layer 502 can have a base portion 518 having a base width 520 in the second direction 511. The first plurality of resonator arms 504 can have respective lengths 523 in the second direction 511, and the second plurality of arms 506 can have respective lengths 524 in the second direction 511.

The second conductive layer 502 can include one or more feed lines 526, 528 respectively connected with vias 530, 532. The vias 530, 532 can have respective widths 534, 536 in the second direction.

The conductive layers 502, 504 can have a length 538 in the first direction 507 and a width 540 in the second direction 511.

II. Performance Characteristics

Figure 6:
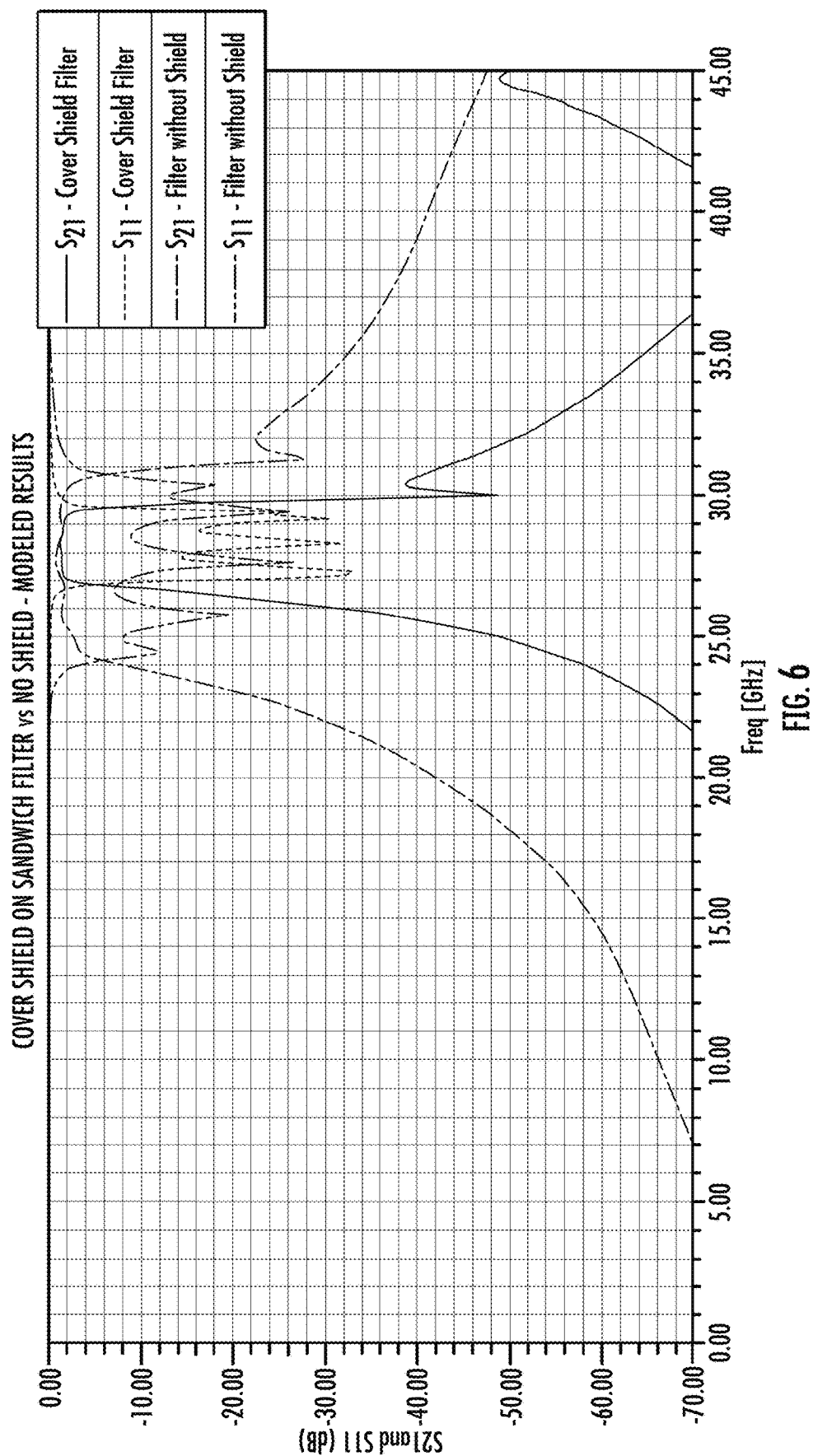
FIG. 6 illustrates insertion loss ($S_{21}$) and return loss ($S_{11}$) results from a computer simulation of the filter of FIGS. 1A through 4 compared with a filter that lacks the cover layer and shield layer.

FIG. 6 illustrates insertion loss ($S_{21}$) and return loss ($S_{11}$) results from a computer simulation of the filter 100 described above with reference to FIGS. 1A through 4 compared with a filter that lacks the cover layer 122 and shield layer 126 yet is otherwise similar (e.g., same dimensions, materials, etc.) to the filer 100. The conductive layers 114, 116 of the filter 100 was dimensioned as described below with reference to the Example described below. As illustrated in FIG. 5, the addition of the cover layer 122 narrows the passband frequency. More specifically, in this example, a passband frequency range of the filter 100 described above with reference to FIGS. 1A through 4 can be defined as frequencies at which the filter 100 exhibits an insertion loss ($S_{21}$) that is greater than −0.3 db. In this example, the bandpass frequency range of the filter 100 described above with reference to FIGS. 1A through 4 is from about 27 GHz to about 29.5 GHZ. The bandpass frequency range of the filter that lacks the cover layer 122 and shield layer 126 has a bandpass frequency range from 25 GHz to about 30.5 GHZ. Thus, the cover layer 122 and shield layer 126 allow narrower bandpass frequency ranges to be achieved with otherwise similar filters.

Additionally, comparing the return losses ($S_{11}$), the addition of the cover layer 122 and shield layer 126 as described herein provides improved out-of-band rejection. More specifically, for the filter 100 that includes cover layer 122 and shield layer 126 exhibits lower insertion loss values for frequencies outside of the bandpass frequency range. For example, the return loss values of the filter 100 drop off rapidly from the upper and lower bounds of the bandpass frequency range. The return loss values of the filter 100 can have a rate of decrease from at the lower bound of about 13.5 dB per GHz at the lower bound of the bandpass frequency range (from about −3 dB at 27 GHz to about −30 dB at 25 GHz). The return loss values of the filter 100 has a rate of decrease about 28 dB per GHz at the upper bound of the bandpass frequency range (from about −3 dB at 29 GHz to about −38 dB at 30.25 GHz).

Figure 7:
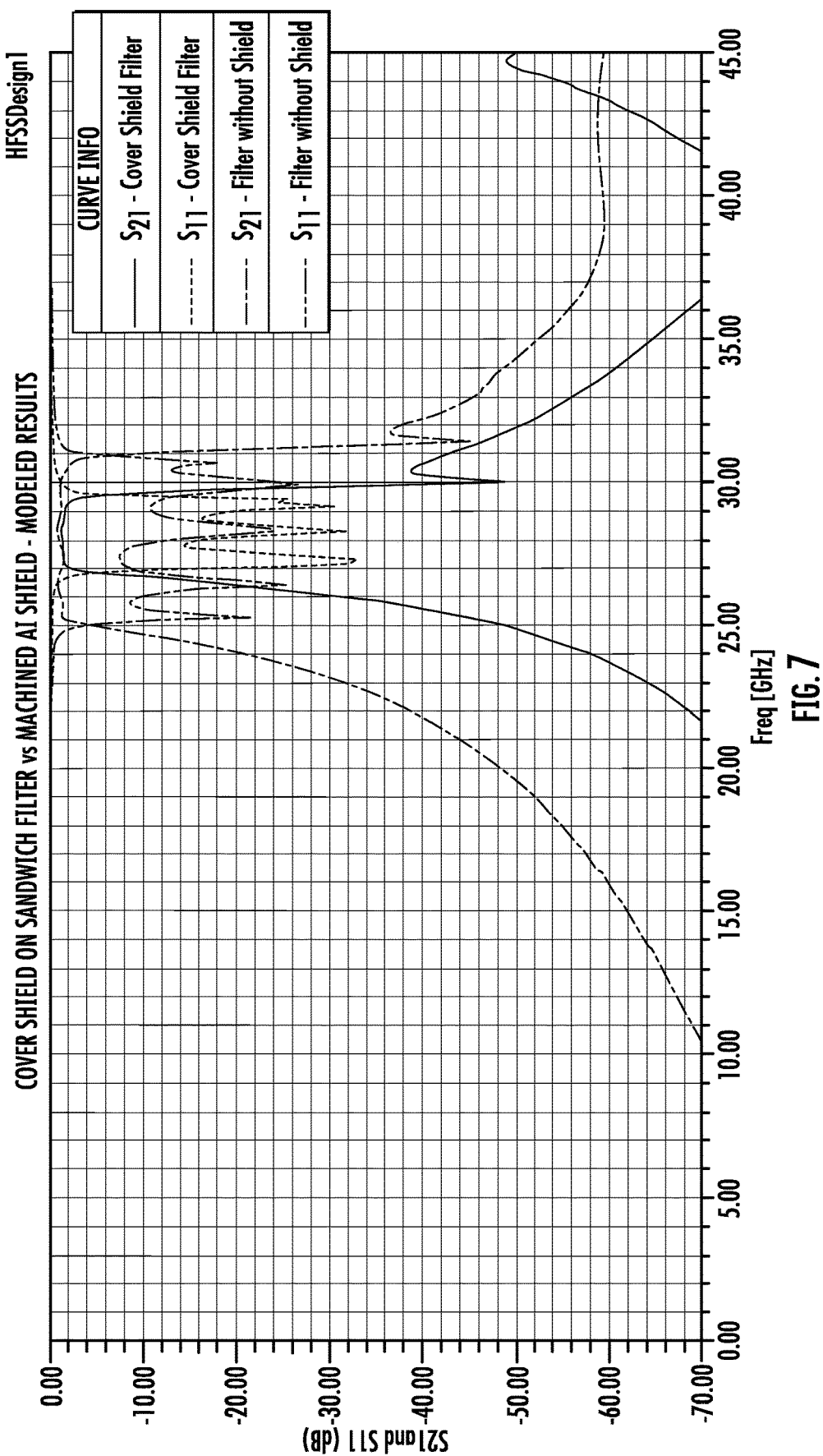
FIG. 7 illustrates insertion loss ($S_{21}$) and return loss ($S_{11}$) results from a computer simulation of the filter described above with reference to FIGS. 1A through 4 compared with a filter having a machined shield in place of the cover layer and shield layer.

FIG. 7 illustrates insertion loss ($S_{21}$) and return loss ($S_{11}$) results from a computer simulation of the filter 100 described above with reference to FIGS. 1A through 4 compared with a filter having a machined shield of aluminum in place of the cover layer 122 and shield layer 126. The bandpass frequency range, as defined above, for the filter including the machined shield is from about 25 GHz to about 30.8 GHz. As indicated above, the bandpass frequency range of the filter 100 described above with reference to FIGS. 1A through 4 is from about 27 GHz to about 29.5 GHZ. Thus, the filter 100 described above with reference to FIGS. 1A through 4 has a narrower bandpass frequency range than the filter with the machined shield. Referring to the return loss plots of FIG. 7, the filter 100 described above with reference to FIGS. 1A through 4 exhibits better out-of-band rejection than the filter including the machined shield.

Figure 8:
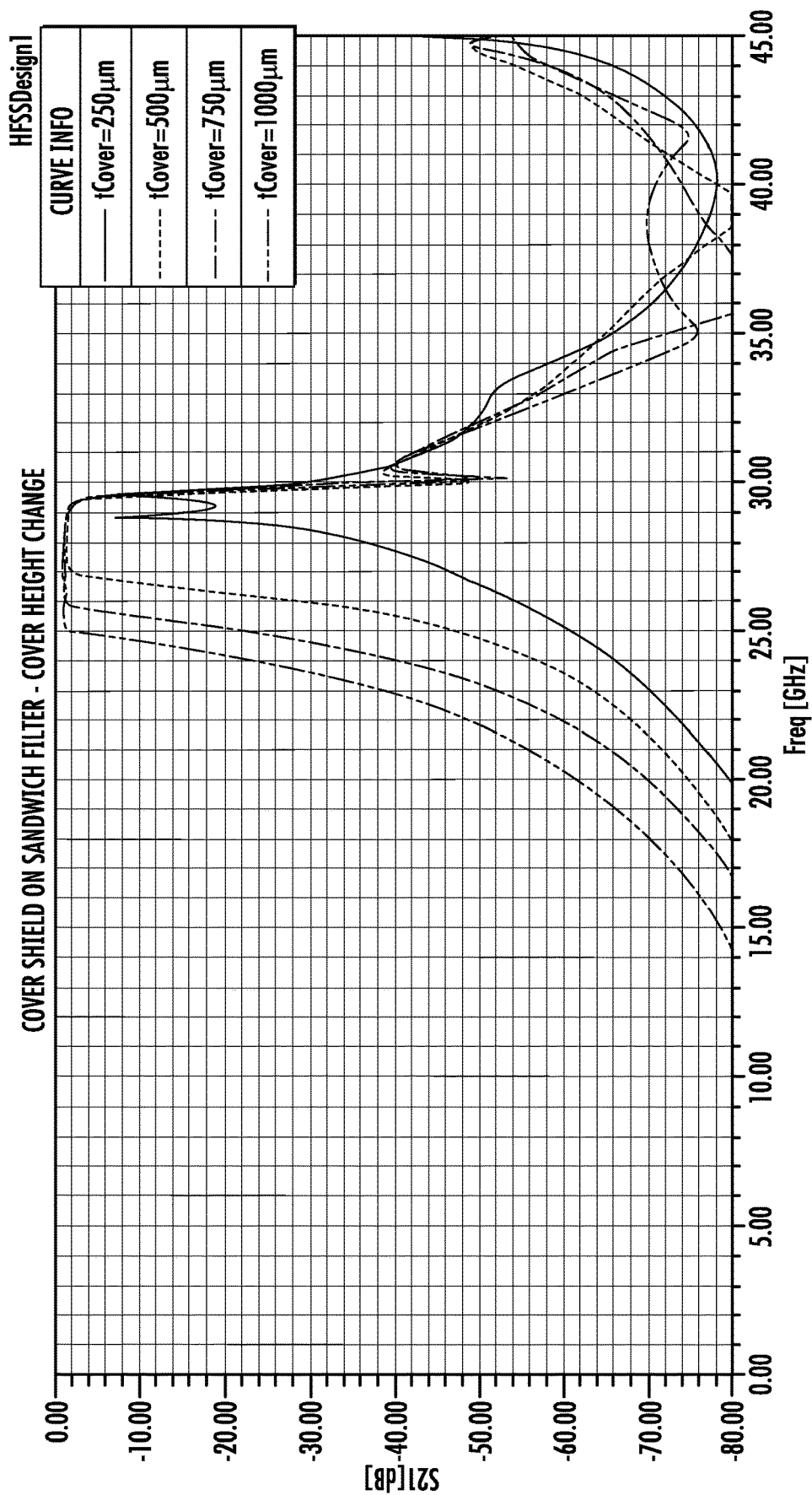
FIG. 8 illustrates four insertion loss curves for the filter described above with reference to FIGS. 1A through 4 having various cover layer thicknesses.

FIG. 8 illustrates four insertion loss curves for the filter 100 described above with reference to FIGS. 1A through 4 having various cover layer thicknesses 160 ranging from 500 μm to 1,000 μm. As shown in FIG. 7, the lower bound of the bandpass range decreases as the thickness 160 of the cover layer 118 increases. The following table shows the bandpass frequency ranges for cover layer thicknesses ranging from 500 μm to 1,000 μm.

| Cover Layer Thickness (μm) | Lower Band Pass Frequency (GHz) | Upper Band Pass Frequency (GHz) | Band Pass Frequency Range (GHz) |
| --- | --- | --- | --- |
| 500 | 26.9 | 29.5 | 2.6 |
| 750 | 25.8 | 29.5 | 3.7 |
| 1,000 | 25 | 29.5 | 4.5 |

Thus, the cover layer thickness 160 can be selected to achieve the desired band pass frequency range.

III. Applications

The filter 100 can be used in a variety of applications. The filter 100 may be particularly useful for applications requiring excellent performance characteristics for frequencies greater than about 10 GHz, 20 GHz, or higher. The filter can provide a narrow band pass frequency range and/or excellent out-of-band rejection. These characteristics can be useful in a variety of systems. For example, the filter can be used in communications systems, military applications, automotive applications, and medical applications. Additionally, the filter 100 may be particularly useful for 5G signal processing (e.g., by a 5G base station), smartphones, signal repeaters (e.g., small cells), relay stations, radar, and radio frequency identification (RFID) devices.

These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A filter comprising:
    a monolithic substrate having a top surface, a first side surface perpendicular to the top surface, a second side surface perpendicular to the top surface, a first top edge along an intersection between the top surface and the first side surface, and a second top edge opposite the first top edge and along an intersection between the top surface and the second side surface;
    at least one conductive layer formed over the top surface of the monolithic substrate and along at least a portion of one or more of the first top edge of the monolithic substrate or the second top edge of the monolithic substrate;
    a cover layer arranged over the top surface of the monolithic substrate, the cover layer having a top surface parallel with the top surface of the monolithic substrate, the cover layer having a first side surface and a second side surface opposite the first side surface, and wherein the first side surface of the cover layer is parallel with the first side surface of the monolithic substrate, and the second side surface of the cover layer is parallel with the second side surface of the monolithic substrate; and
    a shield layer that connects with one or more of the at least one conductive layer at one or more of the first top edge or the second top edge of the monolithic substrate, and wherein the shield layer comprises a first portion formed over the first side surface of the cover layer, a second portion formed over the top surface of the cover layer, and a third portion formed over the second side surface of the cover layer.

2. The filter of claim 1, wherein the first side surface of the cover layer is coplanar with the first side surface of the monolithic substrate, and the second side surface of the cover layer is coplanar with the second side surface of the monolithic substrate.

3. The filter of claim 1, wherein:
    the first portion of the shield layer is also formed over the first side surface of the monolithic substrate; and
    the third portion of the shield layer is also formed over the second side surface of the monolithic substrate.

4. The filter of claim 1, wherein the monolithic substrate has a bottom surface that is opposite the top surface of the monolithic substrate, and wherein the shield layer comprises a fourth portion formed over the bottom surface of the monolithic substrate.

5. The filter of claim 1, wherein:
    the monolithic substrate includes a bottom surface that is opposite the top surface of the monolithic substrate, a first bottom edge at an intersection of the bottom surface of the monolithic substrate and the first side surface of the monolithic substrate, and a second bottom edge at an intersection of the bottom surface of the monolithic substrate and the second side surface of the monolithic substrate; and
    the shield layer comprises a fourth portion formed over the bottom surface of the monolithic substrate and along at least a portion of the first bottom edge of the monolithic substrate, and a fifth portion formed over the bottom surface of the monolithic substrate and along at least a portion of the second bottom edge of the monolithic substrate.

6. The filter of claim 1, wherein the cover layer has a thickness direction that is perpendicular to the top surface of the monolithic substrate, and wherein the thickness of the cover layer ranges from about 250 μm to about 3,000 μm.

7. The filter of claim 1, wherein the filter exhibits an insertion loss response having a band pass frequency range that has a lower bound that is greater than 10 GHz and an upper bound that is greater than the lower limit by less than about 10 GHz.

8. The filter of claim 1, wherein the filter exhibits an insertion loss response having a band pass frequency range that that has a lower bound, an upper bound, and a rate of decrease from at least one of the lower bound or the upper that is greater than about 10 dB per GHz.

9. The filter of claim 1, wherein the at least one conductive layer comprises a first conductive layer and a second conductive layer, the shield layer connecting with the first conductive layer at the first top edge of the monolithic substrate,
    the shield layer connecting with the second conductive layer at the second top edge of the monolithic substrate.

10. The filter of claim 1, wherein the at least one conductive layer comprises a first conductive layer comprising a first plurality of resonator arms and a second conductive layer comprising a second plurality of resonator arms interdigitated with the first plurality of resonator arms of the first conductive layer.

11. A method of forming a filter, the method comprising:
    providing a monolithic substrate having a top surface, a first side surface perpendicular to the top surface, a second side surface perpendicular to the top surface, a first top edge along an intersection between the top surface and the first side surface, and a second top edge opposite the first top edge and along an intersection between the top surface and the second side surface;
    forming at least one conductive layer over the top surface of the monolithic substrate and along at least a portion of one or more of the first top edge of the monolithic substrate or the second top edge of the monolithic substrate;
    arranging a cover layer over the top surface of the monolithic substrate, the cover layer having a top surface parallel with the top surface of the monolithic substrate, the cover layer having a first side surface and a second side surface opposite the first side surface, and wherein the first side surface of the cover layer is parallel with the first side surface of the monolithic substrate, and the second side surface of the cover layer is parallel with the second side surface of the monolithic substrate; and
    forming a shield layer that connects with one or more of the at least one conductive layer at one or more of the first top edge or the second top edge of the monolithic substrate, and wherein the shield layer comprises a first portion formed over the first side surface of the cover layer, a second portion formed over the top surface of the cover layer, and a third portion formed over the second side surface of the cover layer.

12. The method of claim 11, wherein forming the shield layer comprises:

forming the first portion of the shield layer over the first side surface of the monolithic substrate; and forming the second portion of the shield layer over the second side surface of the monolithic substrate.

13. The method of claim 11, wherein forming the shield layer comprises forming a fourth portion of the shield layer over a bottom surface of the monolithic substrate, the bottom surface opposite the top surface of the monolithic substrate.

14. The method of claim 11, wherein forming the shield layer comprises:

forming a fourth portion of the shield layer over a bottom surface of the monolithic substrate and along at least a portion of a first bottom edge of the monolithic substrate that is between the bottom surface of the monolithic substrate and the first side surface of the monolithic substrate; and forming a fifth portion of the shield layer over the bottom surface of the monolithic substrate and along at least a portion of a second bottom edge of the monolithic substrate that is between the bottom surface of the monolithic substrate and the second side surface of the monolithic substrate.

15. The method of claim 11, wherein forming the at least one conductive layer comprises:

forming a first conductive layer over the top surface of the monolithic substrate, the first conductive layer connecting with the shield layer at the first top edge of the monolithic substrate; and forming a second conductive layer over the top surface of the monolithic substrate, the second conductive layer connecting with the shield layer at the second top edge of the monolithic substrate.

16. The method of claim 11, wherein forming the shield layer comprises:

forming a first portion of the shield layer over the first side surface of the cover layer;

forming a second portion of the shield layer over the top surface of the cover layer; and forming a third portion of the shield layer over the second side surface of the cover layer.

17. The method of claim 11, wherein forming the at least one conductive layer comprises:

forming a first conductive layer including a first plurality of resonator arms; and forming a second conductive layer comprising a second plurality of resonator arms interdigitated with the first plurality of resonator arms of the first conductive layer.

* * * * *